United States Patent [19]

Price

[11] 4,347,446
[45] Aug. 31, 1982

[54] EMITTER COUPLED LOGIC CIRCUIT WITH ACTIVE PULL-DOWN

[75] Inventor: John E. Price, Palo Alto, Calif.

[73] Assignee: Amdahl Corporation, Sunnyvale, Calif.

[21] Appl. No.: 101,466

[22] Filed: Dec. 10, 1979

[51] Int. Cl.³ ............... H03K 19/086; H03K 19/092
[52] U.S. Cl. ................................... 307/443; 307/446; 307/455; 307/475; 364/708; 365/63
[58] Field of Search ............. 307/443, 445, 446, 455, 307/467, 475; 340/718; 361/346; 364/708; 365/51, 63

[56] References Cited

U.S. PATENT DOCUMENTS

| Re. 29,917 | 2/1979 | Kumakawa et al. | 307/475 X |
|---|---|---|---|
| 3,577,073 | 5/1971 | Cray | 307/455 X |
| 3,909,636 | 9/1975 | Masaki et al. | 307/443 X |
| 4,031,371 | 6/1977 | De Vries | 364/708 |
| 4,237,388 | 12/1980 | Nokubo et al. | 307/475 X |
| 4,276,485 | 6/1981 | Rydval | 307/455 X |
| 4,278,897 | 7/1981 | Ohno et al. | 307/455 |
| 4,289,978 | 9/1981 | Konian et al. | 307/455 X |

OTHER PUBLICATIONS

Chang et al., "Complementary Driver for Emitter-Coupled-Logic Gates"; IBM Tech. Discl. Bull.; vol. 19, No. 12, pp. 4614–4615; 5/7.
"Monolithic ECL 3-Input Gate Circuit; " MECL ICS Motorola Semiconductor Products Inc. (pub) 8/1963.

Primary Examiner—Larry N. Anagnos
Attorney, Agent, or Firm—Flehr, Hohbach, Test, Albritton & Herbert

[57] ABSTRACT

An emitter coupled logic gate incorporating an active pull-down transistor in the pull-down circuit with bias connections for the pull-down transistor including components in the differential input circuit of the gate so that the pull-down transistor is active only during a HIGH-to-LOW transition of the output logic signal. Single and plural input gates are described together with advantageous exemplary embodiments of integrated circuits utilizing active pull-down ECL gates formed on an IC chip to enable large signal fan-out to other circuits formed on the same IC chip or to off-chip utilization circuits.

12 Claims, 15 Drawing Figures

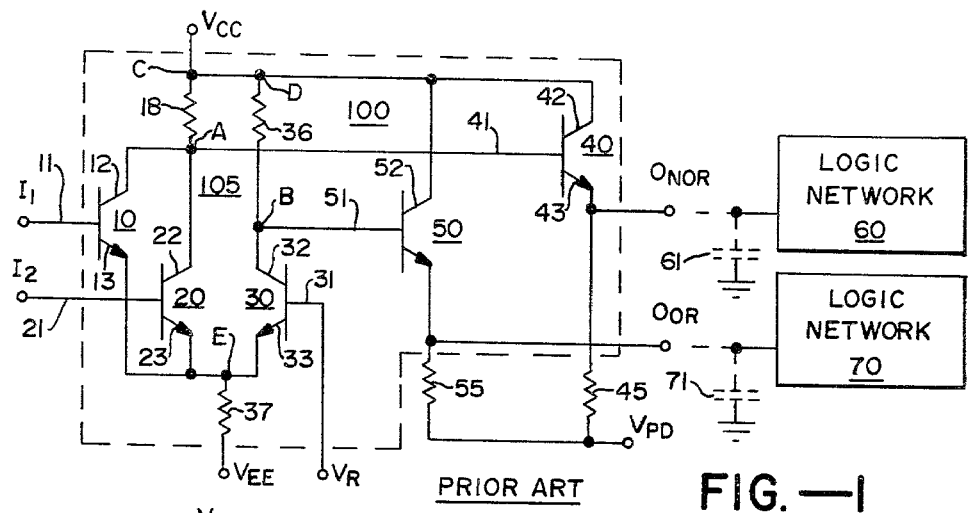
PRIOR ART
FIG.—1
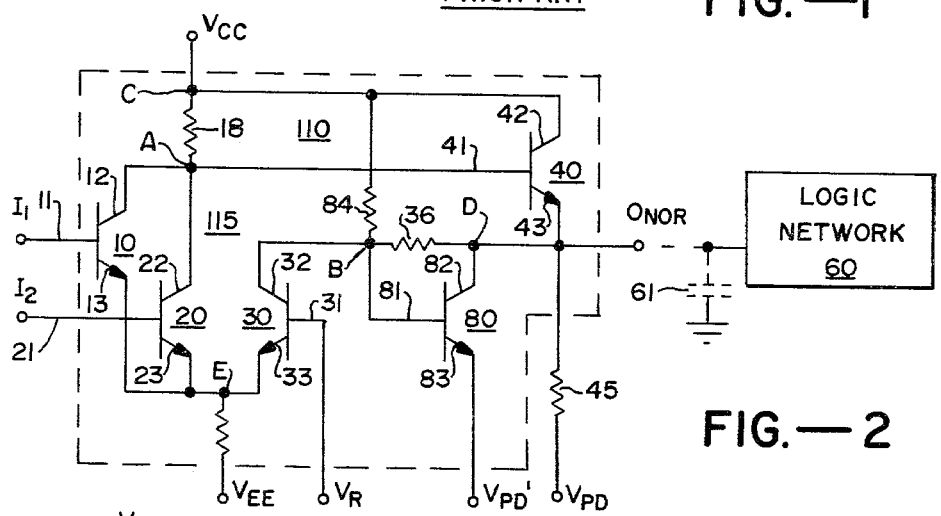
FIG.—2
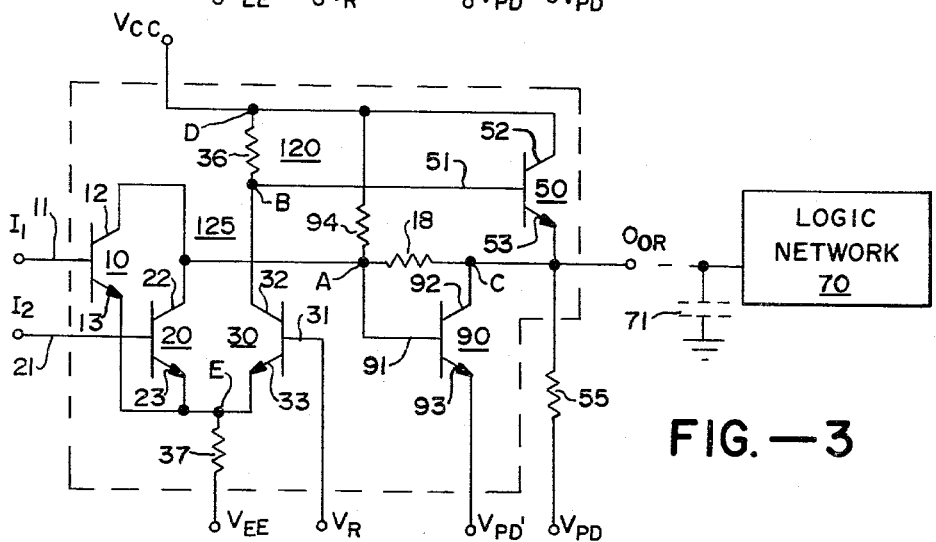
FIG.—3

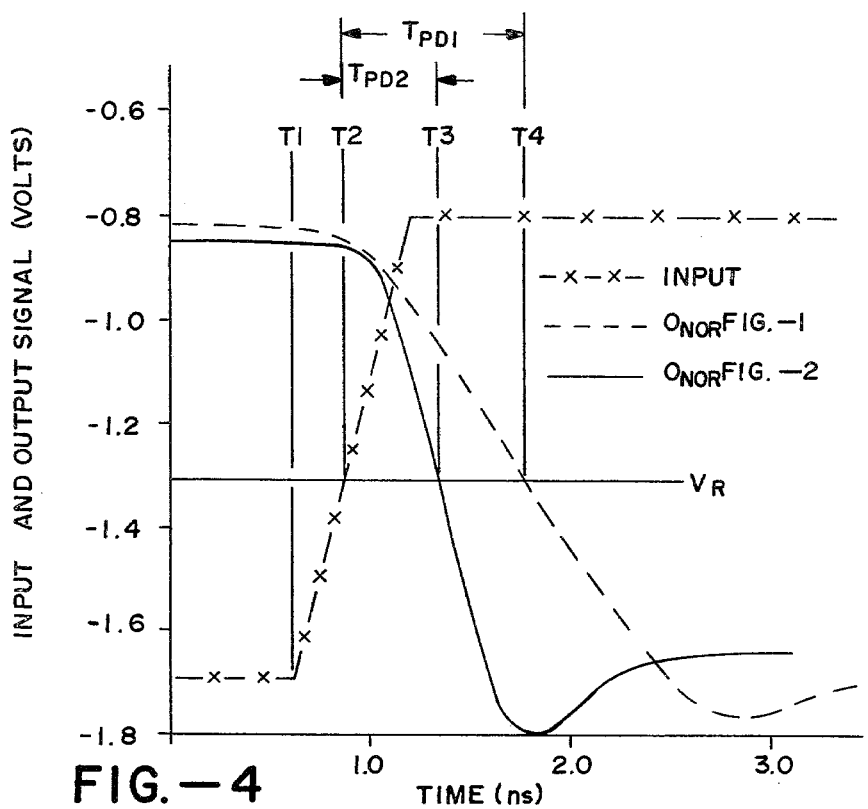
FIG.—4
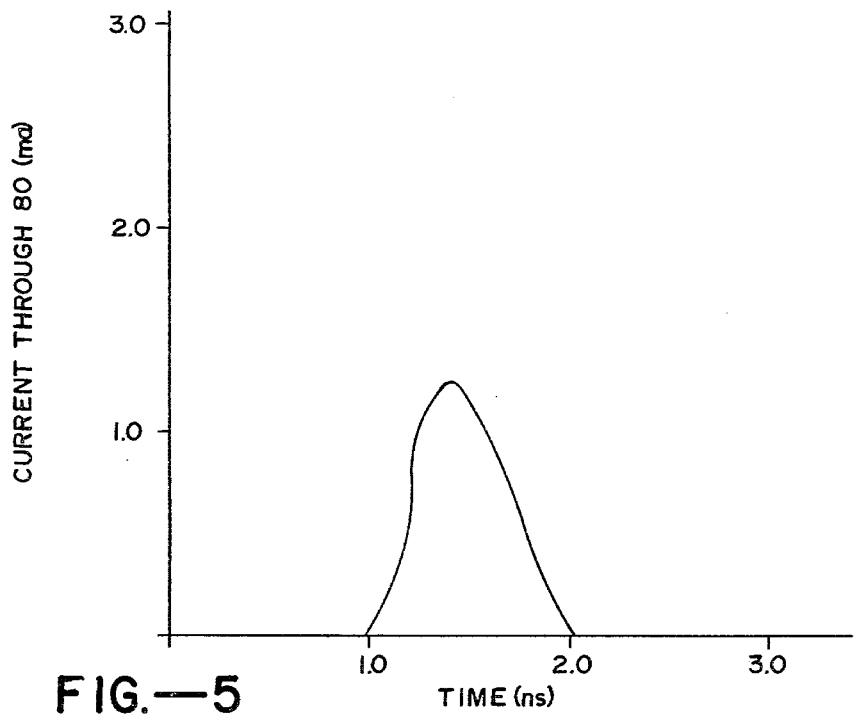
FIG.—5

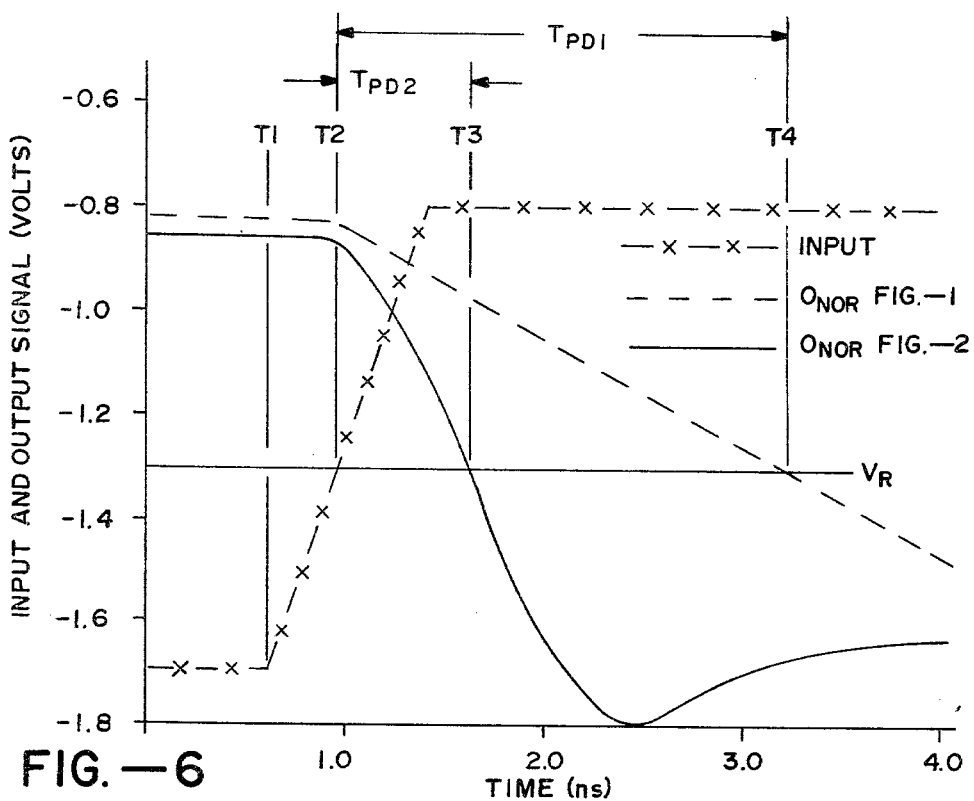
FIG.—6
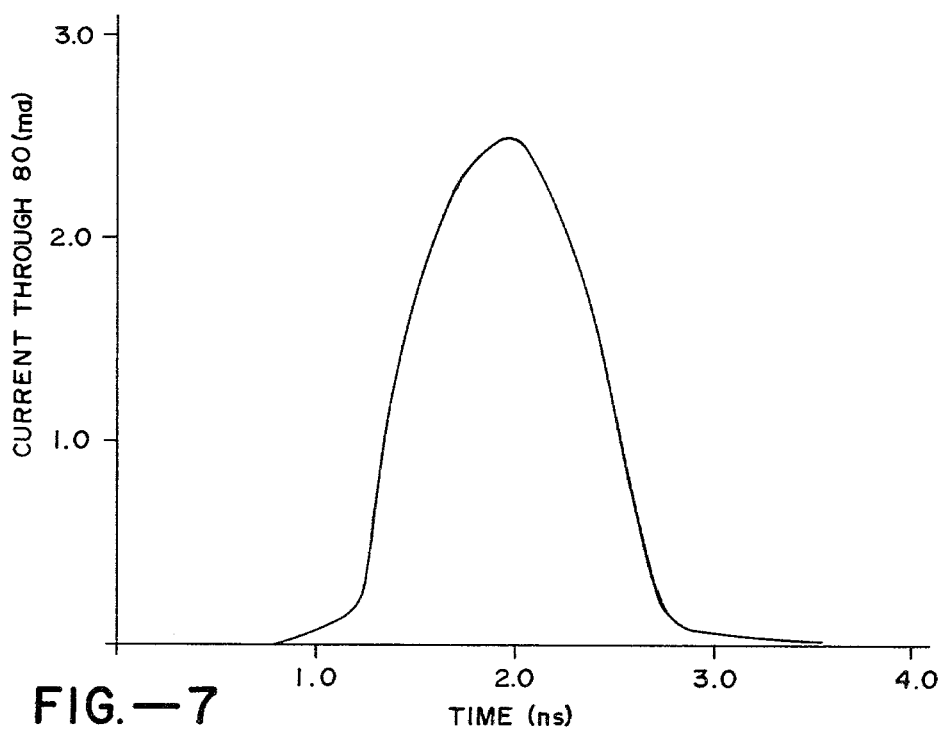
FIG.—7

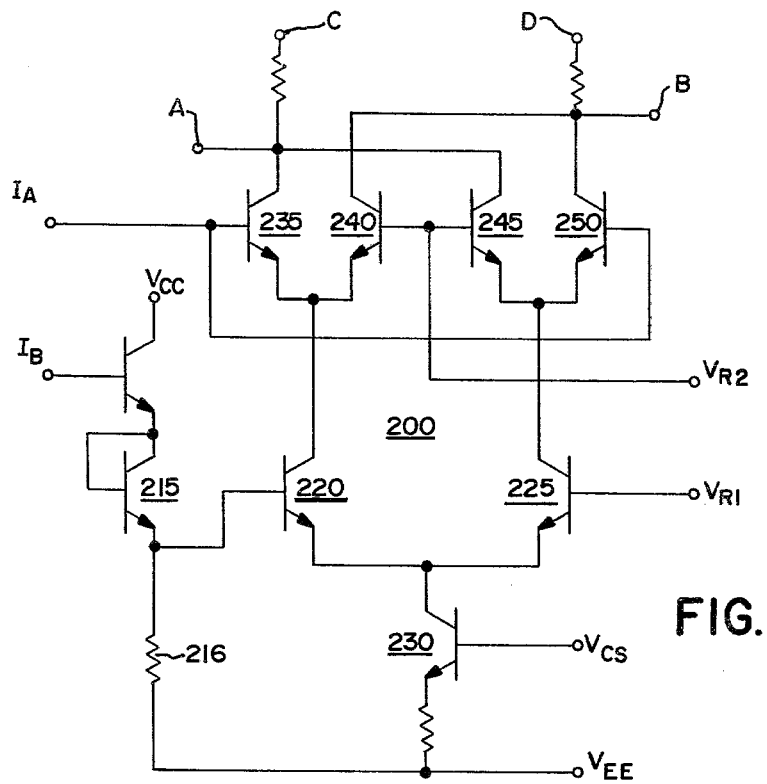
FIG.—8
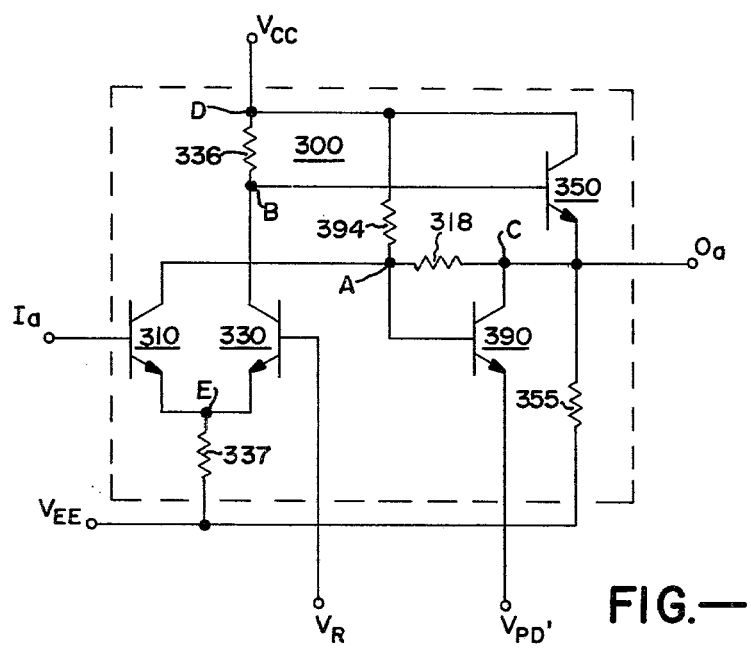
FIG.—9

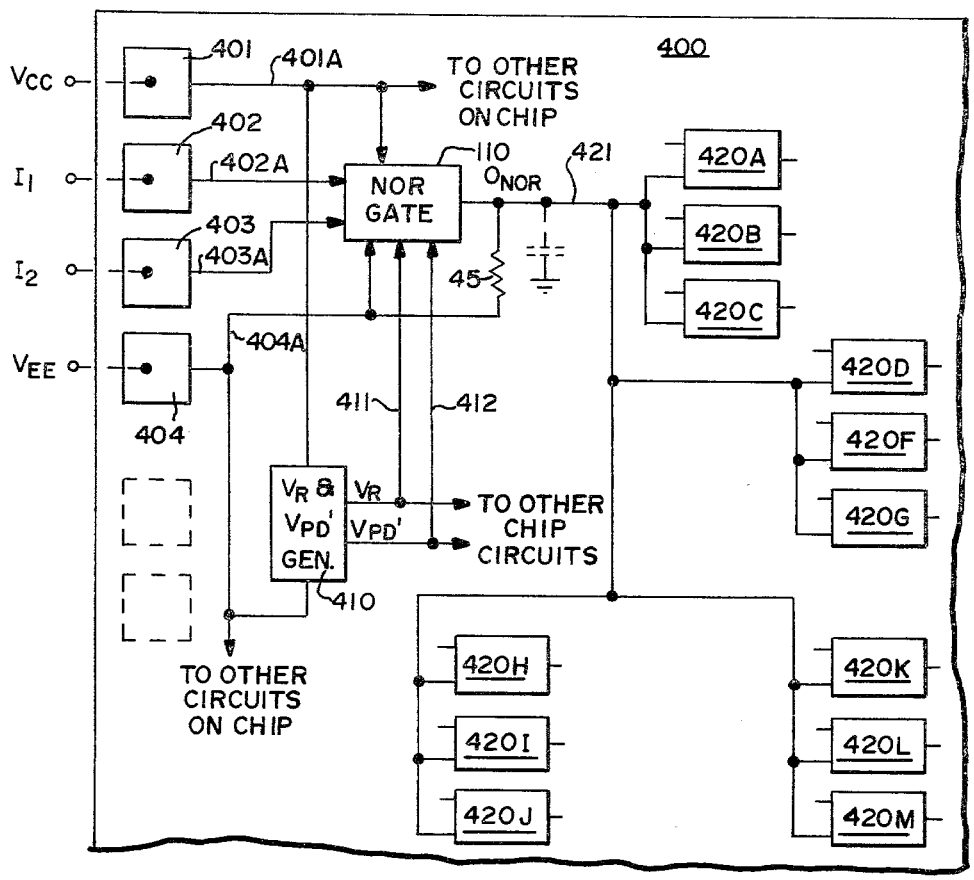
FIG.—10
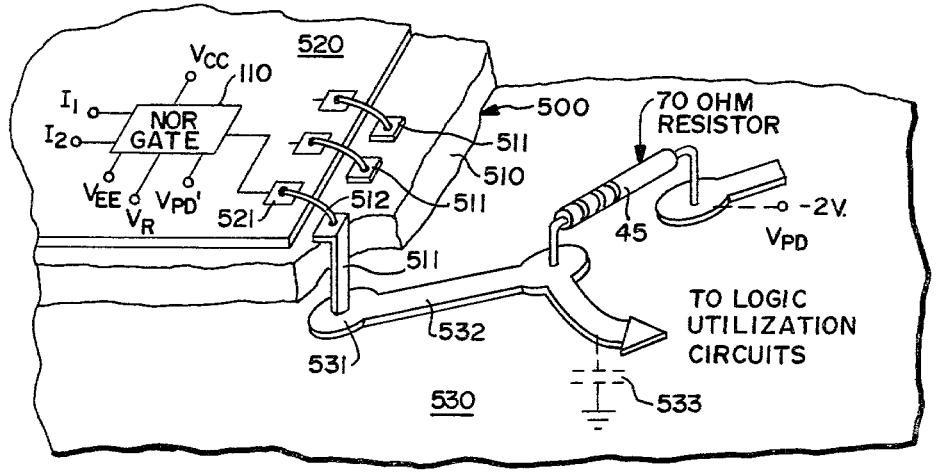
FIG.—11

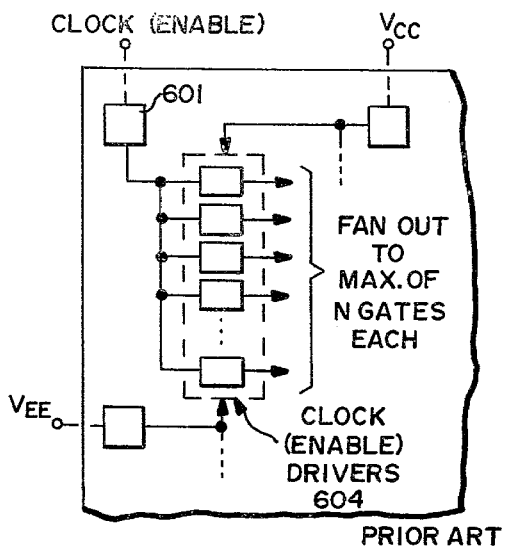
FIG.—12 PRIOR ART
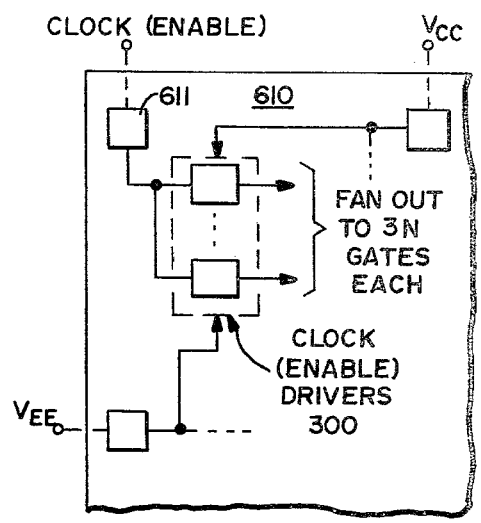
FIG.—13
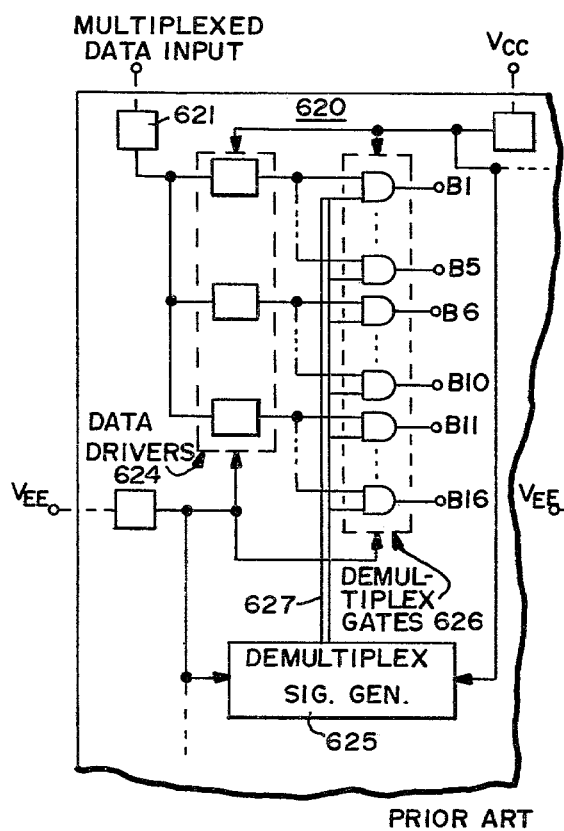
FIG.—14 PRIOR ART
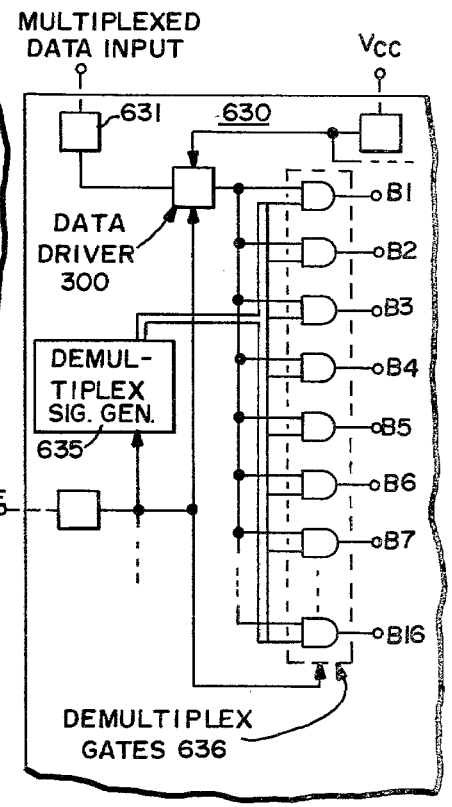
FIG.—15

EMITTER COUPLED LOGIC CIRCUIT WITH ACTIVE PULL-DOWN

BACKGROUND OF THE INVENTION

This invention relates generally to bipolar logic circuits and in particular to emitter coupled logic (ECL) circuits.

ECL circuits are utilized in many large general purpose computers because of the speed at which such circuits operate compared to circuits produced with other technologies such as conductor-insulator-semiconductor field effect transistor (CISFET) technology. ECL gates utilized in current generation ECL integrated circuits (ICs) generally operate with sub-nanosecond signal propagation delays whereas current generation CISFET logic generally operates with about an order of magnitude larger signal propagation delay. While the circuit density (gates per unit of chip area) of ECL ICs is considerably less than CISFET ICs, progress currently being made on new generation ECL technology is expected to increase the circuit density of ECL ICs from a current level of four or five hundred gates per chip to several thousand gates per chip.

One problem faced in increasing ECL circuit density is the power dissipated by each ECL gate and the total power dissipation of an IC comprising an ECL gate array. If the number of ECL gates on an IC chip is substantially increased and each gate draws the same power as in prior generation IC chips, the total power dissipation of the chip will rise dramatically. Such increases in power dissipation probably cannot be tolerated. Generally there are two approaches to attacking the problem of increased power dissipation in high density ECL ICs. One approach involves reducing the DC bias voltages used to operate the chip. The second approach is to increase the values of the resistors utilized in each ECL gate. In some instances a combination of these two approaches may be taken to reduce power dissipation of each gate. Each approach has a potentially adverse impact on ECL technology which must be dealt with.

Reducing bias voltage levels generally requires more careful attention to design considerations such as noise immunity and temperature stability. Increasing the resistance value of resistors utilized in the ECL circuits generally reduces the current available to drive the inherent capacitance seen by the output node of each gate. Where the inherent capacitance of the logic network to be driven by a particular gate is relatively large, such as is typically encountered when the output signal from a particular gate has a large fan-out on the same chip or when the gate is a buffer output gate driving a logic network off-chip through connections to a printed circuit board, increased resistance values can result in substantially increasing the signal propagation delay between the driving gate and the driven network. In the past unacceptably large signal propagation delays have been avoided in ECL technology either by utilizing redundant driving gates or by utilizing additional or lower value pull-down resistors to increase the current available for altering the charge state of the inherent capacitance during a HIGH-TO-LOW signal transition.

Consider for example a typical prior art ECL gate as depicted in FIG. 1 of the accompanying drawings. FIG. 1 depicts a combined NOR and OR logic circuit in which the respective output NOR and OR logic signals are developed at the junctions between emitter-follower transistor 40 and pull-down resistor 45 and the junction between emitter-follower transistor 50 and pull-down resistor 55. As shown, the $O_{NOR}$ output is adapted to drive a logic network 60 which has an inherent capacitance 61 constituting a load capacitance on the $O_{NOR}$ output. In the case that both the ECL gate 100 and the logic network 60 are formed on the same IC chip in accordance with current ECL technology, a specific implementation may involve a resistor 45 with a value of about three thousand Ohms and respective bias voltage values $V_{PD}$ and $V_{CC}$ of $-5.2$ volts and zero volts or ground reference. With these resistance and bias voltage values, the ECL circuit of FIG. 1 will operate with sub-nanosecond signal propagation delays only as long as the value of load capacitance 61 does not exceed about two picofarads. For higher value load capacitances associated with logic network 60, two pull-down resistors having a combined value of about 1.5 K Ohms may be utilized. Sub-nanosecond signal propagation delays can be achieved with two such pull-down resistors up to values of load capacitance of about four picofarads. Of course, utilizing two pull-down resistors increases the power dissipation in the logic gate during the steady state levels of the output logic signals.

Consider now the operating characteristics of the prior art circuit of FIG. 1 if the pull-down resistor values are increased to 4 K Ohms and the pull-down voltage $V_{PD}$ is reduced from $-5.2$ volts to $-3.6$ volts to reduce the power consumption of the gate. With these pull-down resistor and pull-down bias voltage values, the prior art circuit of FIG. 1 can achieve sub-nanosecond signal propagation delays only if the value of load capacitance 61 is about one picofarad or less. Accordingly, the use of prior art ECL gates as depicted in FIG. 1 in new generation ECL IC technology may force ECL circuit designers to choose between reducing the signal fan-out from some logic gates by utilizing redundant driving gates or paying the penalty of increased power dissipation by utilizing more than one pull-down resistor or lower value pull-down resistors in the ECL circuits.

SUMMARY OF THE INVENTION

In accordance with this invention an improved ECL circuit is provided by incorporating an active pull-down transistor (sometimes referred to as a transition transistor) in the pull-down circuit of the ECL gate with bias circuit connections provided for the pull-down transistor advantageously including one of the load resistors in the differential input circuit of the gate so that the pull-down transistor is active only during HIGH-TO-LOW transitions (i.e., transitions in one direction) of the output logic signal.

More specifically, an ECL circuit in accordance with this invention is adapted to supply an output logic signal to drive a logic network having a relatively large inherent capacitance whose charge state must be substantially altered during each logic level transition of the output logic signal producing a signal propagation delay which is directly related to the time interval of the logic level transitions of the output signal. The ECL circuit in accordance with this invention comprises an emitter-follower transistor and a pull-down circuit coupled in series between a pair of bias terminals to form an output terminal at the junction therebetween and a difference circuit adapted to receive at least one input logic signal and one reference voltage signal and having a pair of circuit branches each including a differential signal node and a load resistor coupled between an associated differential signal node and a bias voltage node. A preselected one of the differential signal nodes is coupled to the emitter-followed transistor to drive that transistor to produce an output logic signal functionally related to the input logic signal. The pull-down circuit includes a pull-down transistor coupled between the output terminal and a pull-down terminal adapted to receive a pull-down bias voltage. The other differential signal node is coupled to the pull-down transistor with an associated load resistor coupled to the output terminal. The voltages applied to the pull-down transistor during the steady state intervals of the output logic signal maintain the pull-down transistor in a substantially off condition during those intervals. During at least a portion of each HIGH-TO-LOW signal transition, the voltage on the output terminal causes the pull-down transistor to turn on to supply current for more rapidly altering the charge state of the inherent capacitance.

An ECL circuit in accordance with this invention is particularly advantageously formed on an integrated circuit chip together with a multiplicity of other logic circuits adapted to be driven by the output logic signal with conductive pathways formed on the integrated circuit chip interconnecting the output node of the first logic circuit with the input nodes of the multiplicity of other logic circuits. The inherent capacitances of the multiplicity of logic gates and the capacitance of the conductive paths together form a load capacitance on the output node of the first logic circuit. The active pull-down transistor provided in an emitter coupled logic circuit in accordance with this invention supplies a large amount of current to alter the charge state of the inherent capacitance during the HIGH-TO-LOW signal transition intervals to achieve a signal propagation delay in the HIGH-TO-LOW transition generally comparable to that of the LOW-TO-HIGH transition during which the emitter-follower transistor is supplying current to alter the charge state of the inherent capacitance. Thus, the emitter coupled logic circuit in accordance with this invention enables a relatively large value pull-down resistor to be employed in the logic circuit to minimize power dissipation and still achieve sub-nanosecond signal propagation delays for both the HIGH-TO-LOW and LOW-TO-HIGH logic level transitions of the output logic signal when driving a load capacitance of relatively high value.

Generally, an ECL circuit in accordance with this invention may have one or more logic signal inputs. In the case of a plurality of logic signal inputs, the ECL gate will be configured as one of an OR, NOR, exclusive-OR, or other logic gate whose output may be utilized on the same integrated circuit chip to provide a large signal fan-out to a multiplicity of other logic gates comprising a logic network. An ECL circuit in accordance with this invention may also comprise a signal driver circuit having a single input logic signal and serve as an input signal driver capable of driving a large number of gates on the same chip. In particular, such a single input ECL circuit may be utilized as a clock driver on an integrated circuit chip to provide a signal fan-out to as many as fifteen or twenty other gates on an integrated circuit chip. A single input ECL gate in accordance with this invention may also serve as an enable signal driver also to provide an enable signal fanning out to as many as fifteen or twenty logic gates on the same chip. Utilizing an ECL circuit in accordance with this invention thus enables a reduction in the number of driver circuits required to provide the required signal fan-out at a manageable signal propagation delay, resulting in a saving of power and real estate on the chip and enabling more logic functions to be integrated on a particular chip. A single input ECL gate in accordance with this invention can also be advantageously employed as a data signal driver on an integrated circuit chip to supply a multiplexed data input signal to a sixteen bit demultiplex gate array. Again, the use of a single data driver for a large number of demultiplex gates instead of a plurality of data drivers is made possible by the greater fan-out capability of the ECL circuit in accordance with this invention while maintaining acceptable power dissipation and signal propagation delays. This results in a saving of chip real estate and enables more logic functions to be integrated on a single chip.

An ECL circuit in accordance with this invention is also advantageously employed as an output buffer gate for driving a logic network located off the integrated circuit chip. A buffer gate driving a logic network off-chip generally encounters a large inherent load capacitance associated with the combined inherent capacitances of the bonding pad of the integrated circuit chip, the IC package terminal to which the bonding pad is attached, the component mounting pad on the circuit board to which the package terminal is connected and the conductor pathways communicating between the component mounting pad and the logic utilization circuit driven by the output signal. In driving off-chip the standard approach is to utilize a small value resistor (typically around 70 Ohms) on the circuit board connected between the logic signal path and a negative two-volt pull-down bias terminal. This small value resistor serves as a pull-down resistor and terminates the output signal line with a resistance value matching the characteristic impedance of the printed circuit board to avoid reflections of the output signal. Use of an ECL circuit in accordance with this invention having an active pull-down transistor enables the driving of an off-chip logic network with a large inherent capacitance without degrading the propagation of the output signal during a HIGH-TO-LOW signal transition.

Selective use of an ECL circuit in accordance with this invention will provide the ECL logic designer with the capability of designing a logic network requiring a large fan-out from a single ECL gate without degrading the signal propagation delay during the HIGH-TO-LOW signal transition and without sacrificing the reduced power dissipation which can be achieved by utilizing lower bias voltages and higher pull-down resistor values. Accordingly, the ECL circuit in accordance with this invention will be of material assistance in achieving higher logic function integration levels in ECL gate array ICs without exceeding acceptable signal propagation delays and power dissipation levels.

Other features and advantages of this invention will be apparent from a consideration of the detailed description given below in conjunction with the accompanying drawings.

BRIEF DESCRIPTION OF THE DRAWINGS

FIG. 1 is a schematic circuit diagram of an emitter coupled logic circuit in accordance with the prior art and providing both a NOR and an OR logic function.

FIG. 2 is a schematic circuit diagram of an ECL gate in accordance with this invention in the form of a two-input NOR gate.

FIG. 3 is a circuit schematic diagram of an ECL gate in accordance with this invention in the form of a two-input OR gate.

FIGS. 4–7 are graphs illustrating the comparative performance of the ECL circuits shown in FIGS. 1 and 2.

FIG. 8 is a circuit schematic diagram illustrating a cascoded differential input circuit which may be utilized in any of the ECL circuits shown in FIGS. 1–3.

FIG. 9 is a circuit schematic diagram of a single input ECL gate in accordance with this invention.

FIG. 10 is a block schematic diagram showing the integration of an ECL circuit in accordance with this invention in an overall logic network on an integrated circuit chip.

FIG. 11 is a partly schematic and partly elevational view of an integrated circuit chip mounted on a printed circuit board and utilizing an ECL circuit in accordance with this invention for driving an off-chip logic utilization circuit.

FIG. 12 is a block schematic diagram of a portion of an integrated circuit chip illustrating a signal driver network utilizing prior art ECL gates.

FIG. 13 is a block schematic diagram of a portion of an integrated circuit chip illustrating a signal driver nework utilizing ECL gates in accordance with this invention.

FIG. 14 is a block schematic diagram of a portion of an integrated circuit chip incorporating a data signal demultiplexing arrangement utilizing ECL gates in accordance with the prior art as data drivers.

FIG. 15 is a block schematic diagram of a portion of an integrated circuit chip incorporating a data signal demultiplexing arrangement utilizing a single ECL circuit in accordance with this invention as a data driver.

DESCRIPTION OF PREFERRED EMBODIMENTS

Referring now to FIG. 1, the structure and operation of a prior art two-input ECL gate will be described as a background for considering the improved ECL gate in accordance with this invention as depicted in FIGS. 2 and 3. ECL circuit 100 is basically a two-input gate providing a combined OR and NOR logic function. ECL circuit 100 generally comprises an input difference circuit 105, a pair of emitter-follower transistors 40 and 50 and a pair of pull-down resistors 45 and 55. Input difference circuit 105 has two circuit branches coupled between the respective bias terminals $V_{EE}$ and $V_{CC}$. The left hand circuit branch includes a pair of switching transistors 10 and 20 and a load circuit comprising resistor 18. Transistors 10 and 20 have their respective collector electrodes 12 and 22 connected in common to differential signal node A with load resistor 18 connected between differential signal node A and bias node C. The respective emitter electrodes 13 and 23 of transistors 10 and 20 are connected to a common emitter node B with a common emitter resistor 37 connected between common emitter node E and bias node $V_{EE}$. The respective base electrodes 11 and 21 of transistors 10 and 20 are connected individually to respective input terminals $I_1$ and $I_2$.

The right hand circuit branch of differential circuit 105 includes a reference switching transistor 30 and a load circuit comprising resistor 36. Transistor 30 has its collector electrode 32 connected to differential signal node B with load resistor 36 connected between differential signal node B and a bias node D. The emitter electrode 33 of transistor 30 is connected to common emitter node E, and the base electrode 31 of transistor 30 is connected to a reference voltage node $V_R$.

As shown in FIG. 1, differential signal node A of difference circuit 105 is connected to the base electrode 41 of transistor 40 whereas differential signal node B is connected to the base electrode 51 of transistor 50. The collector electrodes 42 and 52 of transistors 40 and 50 are connected in common to bias nodes C and D to be supplied with the $V_{CC}$ bias potential. The respective emitters 43 and 53 of transistors 40 and 50 are connected individually to output terminals $O_{NOR}$ and $O_{OR}$. Pull-down resistor 45 is connected between output terminal $O_{NOR}$ and a pull-down bias terminal $V_{PD}$. Similarly pull-down resistor 55 is connected between output terminal $O_{OR}$ and bias terminal $V_{PD}$.

As previously indicated, ECL circuit 100 functions as a combined OR and NOR gate; that is, the output on terminal $O_{NOR}$ comprises a logic NOR combination of the logic signals on input terminals $I_1$ and $I_2$ whereas the output signal on output terminal $O_{OR}$ comprises a logic OR combination of the input logic signals on input terminals $I_1$ and $I_2$.

To understand the function of ECL circuit 100, consider first the operation of input difference circuit 105. The voltage on reference voltage terminal $V_R$ is generally set about half-way between the HIGH AND LOW signal state voltages of the input signals on terminals $I_1$ and $I_2$ in the HIGH and LOW signal states. Consider first the case where both input signals $I_1$ and $I_2$ are LOW such that transistors 10 and 20 are both OFF. Under this condition the current through common emitter resistor 37 is conducted through the right hand branch of difference circuit 105, through the collector-emitter circuit of transistor 30 and load resistor 36. The current through load resistor 36 is substantially greater than that through load resistor 18 which carries only the base-emitter current of transistor 40. Correspondingly, the voltage on differential signal node B is substantially lower than that on differential signal node A. Transistors 40 and 50 are connected in an emitter-follower configuration and consequently the voltages on emitters 43 and 53 of transistors 40 and 50, respectively, generally track the voltages on differential signal nodes A and B. Consequently, the signal on output terminal $O_{NOR}$ is at a relatively high level corresponding to a HIGH logic state and the voltage on terminal $O_{OR}$ is relatively low corresponding to a LOW logic state.

If either one or both of the logic signal inputs on input terminals $I_1$ and $I_2$ is HIGH, then either one or both of transistors 10 and 20 in the left branch of input difference circuit 105 are conducting. With one or both of transistor 10 and 20 conducting, the reference transistor 30 turns off. Under these conditions the current through common emitter resistor 37 is conducted through one or both of the collector-emitter circuits of transistors 10 and 20 and through load resistor 18 to develop a relatively low voltage on differential signal node A. Correspondingly, differential signal node B rises to a level near $V_{CC}$.

With these signal conditions on differential signal nodes A and B, the corresponding emitter-follower transistors 40 and 50 produce a LOW logic level signal on output $O_{NOR}$ and a HIGH logic level signal on output $O_{OR}$. It can thus be seen that the signal level on output $O_{NOR}$ is HIGH only when the signal levels on both inputs $I_1$ and $I_2$ are LOW and is LOW when either of the signals on input nodes $I_1$ and $I_1$ is HIGH. This is the standard logic NOR function of the two input signals. Correspondingly, the signal on output terminal $O_{OR}$ is LOW only when the input signals on terminals $I_1$ and $I_2$ are both LOW. Whenever either input signal $I_1$ or $I_2$ is HIGH, the corresponding signal on terminal $O_{OR}$ is HIGH. The output signal on terminal $O_{OR}$ is thus the standard OR combination of the two input signals.

Consider now the operation of gate 100 when it is connected to a logic network 60 having an inherent capacitance 61 serving as a load capacitance on output terminal $O_{NOR}$. During transitions of the logic signal on output terminal $O_{NOR}$, the charge state of inherent capacitance 61 must be changed, and the time required to alter the charge state of load capacitance 61 determines the rapidity with which the transition between HIGH and LOW signal levels can be achieved. This correspondingly determines the signal propagation delay between gate 100 and logic network 60. Inherent capacitance 61 has been shown as being connected between output $O_{NOR}$ and ground reference to represent the total inherent capacitance associated with input nodes of gates in logic network 60 and any conductor paths connecting output terminal $O_{NOR}$ with such input nodes. In actuality the various inherent capacitances are referred to both $V_{CC}$ and $V_{EE}$ voltage levels and in certain instances to intermediate voltage levels. Consequently, some of the inherent capacitances are being charged while others are being discharged during a particular transition of the logic signal on output $O_{NOR}$. However, the current required for altering the state of the inherent capacitance is in the same direction regardless of whether the individual inherent capacitances making up the whole are charging or discharging during any one particular signal transition. Accordingly, we can treat the inherent capacitance as a single lumped capacitance to a ground reference point and consider the operation of logic gate 100 to drive such inherent capacitance during transitions of signal levels on output $O_{NOR}$.

Consider first the operation of gate 100 when the logic signal on output $O_{NOR}$ is making a LOW-to-HIGH signal transition. For purposes of this discussion, it will be assumed that input signal $I_1$ is LOW and input signal $I_2$ is initially HIGH and makes a transition from HIGH to LOW. As the input signal on terminal $I_2$ makes a transition from a HIGH to a LOW level, at some point determined by the voltage on reference node $V_R$, transistor 20 begins to turn off and the voltage on differential signal node A begins to rise. As the voltage on differential signal node A rises, transistor 40 turns on harder providing a heavy driving current for altering the charge state of inherent capacitance 61. Accordingly, the charged state of inherent capacitor 61 is altered very rapidly and the LOW to HIGH signal transition on output terminal $O_{NOR}$ is accomplished in a small time interval, providing a short signal propagation delay time for the rising output.

Consider now the case of a falling output when the logic signal on terminal $O_{NOR}$ is making a transition between a HIGH and LOW logic level. At this time either one or both of the logic signals on input terminal $I_1$ and $I_2$ is rising, and at some point (depending on the voltage on terminal $V_R$) one or both of transistors 10 and 20 will turn ON and transistor 30 will accordingly turn OFF. With this rising input, the voltage on differential bias node A begins to fall, causing the emitter follower transistor 40 to become less conducting. Accordingly, current for altering the charge state of inherent capacitance 61 is drawn through pull-down resistor 45. If the value of load capacitance 61 is relatively high and the value of pull-down resistor 45 is relatively high, the current available for altering the charge state of inherent capacitance 61 will be relatively small and the time required for substantially altering the charged state of inherent capacitance 61 will be relatively long. A corresponding analysis could be utilized for the transitions of the output signal on output terminal $O_{OR}$ driving inherent capacitance 71. If the resistance value of pull-down resistor 45 is lowered in order to alter the charge state of capacitance 61 more quickly during a falling output transition, the amount of current through resistor 45 during a steady state level of the output signal will be substantially higher, increasing the power dissipation of the gate.

FIG. 2 depicts a logic NOR gate 110 in accordance with this invention. For comparative purposes, the same reference numerals are utilized in FIG. 2 as in FIG. 1, where the circuit components and respective nodes are essentially the same. In FIG. 2, the input difference circuit 115 utilizes the same two input switching transistors 10 and 20 and the same reference switching transistor 30. However, while differential signal node A is coupled to the base 41 of emitter follower transistor 40, differential signal node B is coupled to the base of a pull-down (or transition) transistor 80 which forms with pull down resistor 45 and associated bias connections an overall pull-down (or transition) circuit.

Load resistor 36 associated with differential signal node B is connected to output terminal $O_{NOR}$, i.e., the node D is connected in common with the output terminal $O_{NOR}$. The collector 82 of pull-down transistor 80 is also connected to node D and in common with output terminal $O_{NOR}$. The emitter 83 of pull-down transistor 80 is connected to a pull-down bias terminal $V_{PD}$. A bias resistor 84 is connected between differential signal node B (i.e. the base 81 of pull-down transistor 80) and bias node C which receives $V_{CC}$ bias voltage.

The operation of ECL NOR-gate 110 during steady-state logic level intervals is essentially the same as the corresponding NOR-gate function of ECL circuit 100. If both signal inputs on input terminals $I_1$ and $I_2$ are LOW, such that transistors 10 and 20 are OFF, transistor 30 is conducting. Since differential signal node A is HIGH, transistor 40 is conducting heavily and substantial current is drawn through load resistor 36, providing a substantial voltage drop between output terminal $O_{NOR}$ and differential bias node B connected to the base 81 of transistor 80. The voltage on pull-down bias node $V_{PD}$, is set to a level which maintains transistor 80 in an OFF condition with its base-emitter junction biased just below the cut-off level. Bias-resistor 84 and bias voltage $V_{PD}$, together maintain the base electrode 81 of pull-down transistor 80 just at or below the turn-on point of that transistor when output signal $O_{NOR}$ is at a HIGH logic signal level.

During a steady state LOW logic signal level on output terminal $O_{NOR}$, transistor 30 is OFF and one or both of transistors 10 and 20 are ON. Accordingly, differential signal node A and output terminal $O_{NOR}$ both have a relatively low voltage thereon and emitter-follower transistor 40 is conducting only slightly. With transistor 30 OFF, no current is drawn through resistor 36, so differential bias node B and base 81 of pull-down transistor 80 are both at about the same low voltage level as output terminal $O_{NOR}$. This voltage level maintains transistor 80 in an OFF condition with its base-emitter junction biased below the cut-off level during the steady state interval of a LOW output signal on terminal $O_{NOR}$.

Consider now the operation of ECL NOR-gate 110 during a HIGH-to-LOW transition of a logic signal on output terminal $O_{NOR}$. When output terminal $O_{NOR}$ is HIGH, both transistors 10 and 20 are OFF and differential bias node A is HIGH. Correspondingly, differential signal node B is LOW, since transistor 30 is ON. When a rising input on one of input terminals $I_1$ and $I_2$ causes one or both of transistors 10 and 20 to turn ON, the voltage on differential signal node A begins to fall and transistor 30 turns OFF. When transistor 30 turns OFF, the current through load resistor 36 substantially decreases and the voltage on differential signal node B rises to a level such that transistor 80 has a heavy forward bias on its base-emitter junction and transistor 80 turns ON hard. With transistor 80 heavily conducting, a large amount of current is supplied for altering the capacitance state of inherent capacitance 61 coupled to the output terminal $O_{NOR}$. This enables the charge state of capacitance 61 to be altered rapidly, and accordingly the HIGH-to-LOW signal transition interval is shortened. Since the voltage on differential bias node B tracks the falling voltage on output terminal $O_{NOR}$, near the end of the HIGH-to-LOW signal transition, the voltage on differential bias node B drops to a level where transistor 80 is no longer biased above the cut-off level. At this point, transistor 80 turns OFF. Bias resistor 84 combines with load resistor 36 during the HIGH-to-LOW signal transition interval to divide the voltage on output terminal $O_{NOR}$. Accordingly, the voltage on differential bias node B coupled to the base 81 of transistor 80 will be maintained slightly higher than if resistor 84 were not utilized. This maintains transistor 80 on for a longer period of time, since its base-emitter junction will be forward biased for a longer time.

It can thus be seen that the incorporation of pull-down transistor 80 in ECL NOR circuit 110 enables the use of a relatively high value pull-down resistor 45 to minimize power dissipation in the gate while retaining a fast pull-down characteristic when NOR-gate 110 is driving a relatively large inherent load capacitance.

FIG. 3 shows an ECL OR-gate 120 which corresponds substantially to the OR-gate portion of prior art ECL circuit 100 shown in FIG. 1, but with the addition of a pull-down transistor 90 integrated with the left-hand branch of difference circuit 125. Pull-down transistor 90 operates in the same fashion on a falling-output in ECL OR-gate 120 as does pull-down transistor 80, shown in FIG. 2 and previously described. In this case, the differential signal node A is coupled to the base 91 of pull-down transistor 90 with load resistor 18 connected to the output terminal $O_{OR}$. Since the operation of pull-down transistor 90 in ECL OR-gate 120 is essentially the same as the operation of pull-down transistor 80 in ECL NOR-gate 110 shown in FIG. 2, it is not necessary to repeat the details of this operation.

To demonstrate the improvement in performance of the ECL NOR-gate 110 shown in FIG. 2 compared to the NOR function of the ECL gate 100 shown in FIG. 1, time domain computer simulations were made of both circuits, utilizing the bias-voltages and component values shown in the following Table I and only a single input:

TABLE I

| Bias Voltages (volts) | |
|---|---|
| $V_{CC}$ | 0 volts |
| $V_{EE}$ | −3.6 volts |
| $V_R$ | −1.3 volts |
| $V_{PD'}$ | −2.0 volts |
| $V_{PD}$ | −3.6 volts |
| Resistor Values (Ohms) | |
| 18 | 1.35 K |
| 36 | 1.8 K |
| 37 | 3.0 K |
| 45 | 4.0 K |
| 84 | 7.41 K |
| Capacitance Values (picofarads) | |
| Node A | 0.026 |
| Node B | 0.031 |
| Node E | 0.034 |
| 61 | 1.0 and 3.0 |

The capacitance values given for nodes A, B, and E correspond to anticipated inherent capacitances associated with these nodes.

FIGS. 4 to 7 and Table II (below) illustrate the relative performance of the circuits of FIG. 1 and FIG. 2 during a rising input and a falling output, with the load capacitance 61 being 1.0 picofarad in one case (FIGS. 4 and 5) and 3.0 picofarads in the other case (FIGS. 6 and 7). Consider FIGS. 4 and 5 together with the first two columns of Table II illustrating the relative performance of the circuits of FIG. 1 and FIG. 2, when a 1.0 picofarad load capacitance is being driven.

TABLE II

| | 100 | 110 | 100 | 110 |
|---|---|---|---|---|
| C[61] (pf) | 1.0 | 1.0 | 3.0 | 3.0 |
| FALL TIME (ns) (20% to 80%) | 0.90 | 0.34 | 2.83 | 0.57 |
| $T_{PD}$ (ns) [HIGH to LOW] | 0.80 | 0.43 | 2.31 | 0.74 |
| $T_{PD}$ (ns) [LOW to HIGH] | 0.24 | 0.27 | 0.43 | 0.47 |
| $O_{NOR}$ [high] (volts) | −0.8 | −0.8 | −0.8 | −0.8 |
| $O_{NOR}$ [low] (volts) | −1.7 | −1.7 | −1.7 | −1.7 |

FIG. 4 shows the input and output signal level in volts as a function of time during a rising input and a corresponding falling output. FIG. 5 shows the current through pull-down transistor 80 during the same time interval. As shown in FIG. 4, prior to time $T_1$, the input signal is LOW (about −1.7 volts). Correspondingly, the output signal is HIGH (about −0.8 volts). At time $T_1$, the input signal begins to make a LOW-to-HIGH transition. At time $T_2$, the value of the input signal has reached about −1.3 volts, the reference bias level. Accordingly, one of the input transistors begins to turn ON, causing the output signal to begin to fall. FIG. 4 shows that signal on $O_{NOR}$ terminal in the circuit of FIG. 1 falls to the −1.3 voltage level during the interval from $T_2$ to time $T_4$, and continues falling to a final steady state level of about −1.7 volts. Assuming that the triggering level of the gates in the driven logic network 60 are also as the −1.3 volt level, the time between $T_2$ and $T_4$ represents the signal propagation delay to a falling output of the NOR circuit of FIG. 1. This signal propagation delay is labeled $T_{PD1}$ on FIG. 4. As shown in Table II the time $T_{PD1}$ is about 0.80 nanoseconds. In comparison, the output signal $O_{NOR}$ of ECL NOR gate 110 in FIG. 2 drops to the trigger level of −1.3 volts between times $T_1$ and $T_3$ on the graph of FIG. 4 corresponding to a signal propagation delay of 0.43 nanoseconds.

FIG. 5 shows the current through transistor 80 during the fall time of the output signal on terminal $O_{NOR}$. As shown, the current drawn by transistor 80 increases rapidly between the time $T_2$ and time $T_3$, corresponding to the transistor 80 turning ON hard to supply a large amount of current to alter the charge state of inherent capacitance 61. Transistor 80 continues to conduct past the triggering point of the gates in the logic network 60 fed by the NOR-gate 110. Accordingly, it can be seen that the fall time of NOR-gate 110, i.e., the time between the 20% and 80% signal levels, is only 0.34 nanoseconds, whereas the corresponding fall time of prior art NOR-gate 100 is 0.90 nanoseconds, as shown in Table II above.

Table II also shows that a small increase in signal propagation delay to a falling input and corresponding rising output is experienced in ECL NOR-gate 110 in accordance with this invention. However, the increase in signal propagation delay to a falling input is very small, in this case only 0.03 nanoseconds.

FIGS. 6 and 7 show the comparative performance of the circuits of FIG. 1 and FIG. 2 when the inherent capacitance driven by the respective circuits is 3.0 picofarads. As shown in FIG. 6 the signal propagation delay $T_{PD1}$ between times $T_2$ and $T_4$ is substantially increased to a time interval set forth in Table II as 2.31 nanoseconds. In contrast, the signal propagation delay $T_{PD2}$ between times $T_2$ and $T_3$ associated with the performance of the circuit of FIG. 2 is only 0.74 nanoseconds. FIG. 7 shows that pull-down transistor 80 supplies a very heavy current to the 3.0 picofarad inherent load capacitance during the time interval between $T_2$ and $T_3$ causing the output signal to drop more rapidly on output terminal $O_{NOR}$ during that interval.

Assuming that the respective NOR-gates 100 and 110 shown in FIGS. 1 and 2 respectively are employed in a computer system operating at a clock speed which requires sub-nanosecond propagation delays throughout the logic network, it is apparent that the circuit of FIG. 2 in accordance with this invention has at least three times the signal fan-out capability of a prior art circuit as shown in FIG. 1. The bias voltages and resistance values utilized in the computer simulation of the respective FIG. 1 and FIG. 2 circuits corresponds closely to those anticipated for use in subsequent generations of ECL logic circuits. Experience indicates that the computer simulation data generally corresponds quite closely with the actual performance of the circuits when implemented in a test circuit. In any event, the comparative performance is accurately demonstrated by the computer simulation of each individual circuit.

ECL circuits in accordance with this invention are not limited to the NOR and OR circuits illustrated in FIGS. 2 and 3. Other types of logic functions can also be provided as in prior art ECL gates. For example, FIG. 8 shows a differential input circuit 200 having cascoded difference circuit stages which together provide an exclusive-OR/exclusive-NOR logic function. FIG. 8 also shows the alternative of using a current source transistor 230 in the common emitter circuit of the two branches of the differential input circuit. As shown in FIG. 8, a first input $I_A$ serves as an input to transistors 235 and 250. Transistors 240 and 245 complete a pair of difference circuits with respect to the input signal on terminal $I_A$ and a reference bias voltage on terminal $V_{R2}$. Input terminal $I_B$ serves as an input to transistor 210 which together with transistor 215 and resistor 216 shifts the level of the signal on terminal $I_B$ and applies it to the input of transistor 220. Transistor 225 has a reference bias input on terminal $V_{R1}$ which is lower than that on terminal $V_{R2}$. Since the details of operation of this type of differential input circuit are well known to those of skill in the ECL gate art, it need not be described in detail here.

Difference circuit 200 can be substituted for difference circuit 115 in FIG. 2 to provide an exclusive-OR function with the output signal being LOW only when both inputs $I_A$ and $I_B$ are at the same logic level. Correspondingly, difference circuit 200 can be substituted for difference circuit 125 in the circuit shown in FIG. 3 to provide an exclusive-NOR function with the output signal on output terminal $O_{OR}$ being HIGH only when the respective input signals on terminals $I_A$ and $I_B$ are at the same logic level.

FIG. 9 shows a signal driver circuit 300 in accordance with this invention. Signal driver circuit 300 essentially comprises a single input ECL gate having an output signal on terminal $O_a$ corresponding in logic value to the input signal on a terminal $I_a$. The configuration of the circuit of FIG. 9 is substantially the same as the ECL OR-gate 120 shown in FIG. 3 with the exception that one of the input transistors has been deleted. A single-input signal driver gate could also be fashioned in accordance with a circuit structure as shown in FIG. 2 to provide an output signal which is the logical inverse of the input signal. Reference numerals shown in FIG. 9 correspond to the reference numerals used in FIG. 3 but with a "3" in front of each number. The circuit of FIG. 9 operates substantially in the same manner as the circuits of FIGS. 2 and 3, and thus this operation need not be described in detail herein. The pull-down transistor 390 functions in the same fashion as the respective pull-down transistors 80 and 90 in FIGS. 2 and 3 during a HIGH-to-LOW signal transition on output $O_a$. Consequently, ECL gate 300 can drive a logic network with substantially more inherent capacitance than would be possible with a corresponding prior art signal driver circuit.

FIG. 10 illustrates the use of ECL NOR-gate 100 on an integrated circuit chip 400. FIG. 10 shows NOR-gate 110 with its output node $O_{NOR}$ driving a multiplicity of other logic gates 420A through 420M formed on the same integrated circuit chip 400. The reference numeral 421 generally designates conductor paths formed on integrated circuit chip 400 connecting output terminal $O_{NOR}$ with the respective input nodes of gates 420A through 420M. Inherent load capacitance 422 on output terminal $O_{NOR}$ constitutes the sum of the input capacitances of gates 420A through 420M and the inherent capacitance of the conductor paths 421. Since NOR-gate 110 is driving a logic network on the same chip, pull-down resistor 45 is also formed on the same chip and is conveniently connected with its pull-down bias $V_{PD}$ (FIG. 2) connected to the $V_{EE}$ bias node.

FIG. 10 shows four bonding pads, 401 through 404 formed on integrated circuit chip 400 being adapted to receive, respectively, a bias signal $V_{CC}$, an input signal $I_1$, an input signal $I_2$, and a bias voltage $V_{EE}$. A conductor path generally designated 401A, is formed on integrated circuit chip 400 to connect bonding pad 401 with all of the circuitry on chip 400 requiring the $V_{CC}$ bias voltage. In particular, conductor 401A leads from bonding pad 401 to NOR-gate 110 and to the $V_R$ and $V_{PD}$ signal generator 410. It would also lead to all other circuits with active components on chip 400. Correspondingly, reference numeral 404A designates the conductor pathways formed on integrated circuit chip 400 to connect bonding pad 404 with various circuits requiring the $V_{EE}$ bias voltage. In particular, as shown, conductor path 404A connects bonding path 404 with NOR-gate 110, pulldown resistor 45, and $V_R$ and $V_{PD'}$ signal generator 410. Conductor pathways 402A and 403A formed on integrated circuit chip 400 connect bonding pads 402 and 403, respectively, to NOR-gate 110. In this case, it is assumed that the two input logic signals received on bonding paths 402 and 403 are not routed to other places on the chip, although in many instances, input signals will be routed to a number of different ECL gates on a particular chip. $V_R$ and $V_{PD'}$ signal generator 410 utilizes the bias signals $V_{CC}$ and $V_{EE}$ to generate two intermediate voltages $V_R$ and $V_{PD'}$ to be supplied to NOR-gate 110 via conductor pathways 411 and 412. FIG. 10 shows only a small portion of the circuitry which would be included on a particular integrated circuit chip utilizing an ECL gate array but it illustrates that NOR-gate 110 constructed in accordance with this invention is capable of providing a large signal fan-out. Utilizing NOR-gate 110 will permit a logic designer to design circuits having a large signal fan-out without adversely affecting the signal propagation times. No attempt is made in FIG. 10 to depict any particular logic network since NOR-gate 110 can be applied in a wide variety of logic networks. FIG. 10 together with FIGS. 4–7 and Tables I and II illustrate that ECL gates according to this invention will enable large signal fanout on an IC chip even when lower bias voltages and higher resistance values are employed to reduce overall power dissipation of the chip.

FIG. 11 illustrates the use of a NOR-gate 110 in accordance with this invention to drive a logic network "off chip." The term "off chip" refers to the fact that the logic network driven by NOR-gate 110 exists someplace other than integrated circuit chip 520 on which NOR-gate 110 is formed. For example, printed circuit board 530 might have a large number of integrated circuits mounted on it with printed circuit conductor pathways 532 leading between various component mounting pads (e.g. 531) associated with one integrated circuit to corresponding mounting pads associated with other integrated circuits.

As shown in FIG. 11, when NOR-gate 110 is utilized to drive off-chip, the pull-down resistor 45 is provided on the printed circuit board as a small-value resistor, for example, a 70 OHM resistor, as illustrated in FIG. 11. Since the inherent capacitance of the off-chip network driven by NOR-gate 110 in FIG. 11 may be twenty picofarads or more, the resistor values in NOR-gate 110 are made smaller and the transistor sizes are made larger in order to provide substantial current for driving this inherent load capacitance. Pull-down transistor 80 in NOR-gate 110 is important in this application since it enables the driving of a larger capacitive load off-chip while maintaining sub-nanosecond signal propagation delay.

The inherent capacitance 533 shown in FIG. 11 is contributed to by a number of elements where the output of NOR-gate 110 is supplied to an off-chip logic utilization circuit. The inherent capacitance 533 represents the sum of the capacitances of such elements as bonding pad 521, wire 512 connecting bonding pad 521 with package terminal 511, the component mounting pad 531, conductor pad 532 formed on printed circuit board 530, and the total input capacitance of the logic utilization circuits. FIG. 11 shows one way of mounting the integrated circuit chip 520 on printed circuit board 530 utilizing an integrated circuit package 500 having terminals 511 which plug into component mounting pads on printed circuit board 530. This is exemplary of one approach, and those familiar with the integrated circuit art appreciate that there are several alternative approaches available for packaging ICs and mounting them on printed circuit boards, all of the systems, however, still involving substantial inherent capacitance which must be driven by the output buffer gate.

FIGS. 12 and 13 illustrate the saving in chip real estate which can be achieved utilizing the signal driver gate of FIG. 9 on an integrated circuit chip. As shown in FIG. 12, integrated circuit chip 600 has a plurality of prior art clock drivers 604 formed on chip 600 for providing fan-out of a clock or enable signal received on bonding pad 601 to a number of logic gates on the chip. Utilizing prior art signal drivers 604 without any active pulldown transistor limits the number of gates to which the output of each signal driver can fan out. In this case, this number is designated N since the actual fan-out capability of a prior art signal driver is dependent on the design of the driver and the particular signal propagation delay which can be tolerated in the system in which the integrated circuit chip 600 is employed. In an exemplary system characteristic of the current state of the art, signal driver outputs can fan-out to only about six or seven gates each. If a particular integrated circuit chip requires a total signal fan-out to as many as thirty or so gates, the total chip real estate occupied by the five or six signal drivers required is substantial and subtracts from the chip real estate available to perform other logic functions.

However, as depicted in FIG. 13, when signal drivers 309 (FIG. 9) incorporating an active pull-down transistor arrangement in accordance with this invention are utilized on integrated circuit chip 610, one-third as many signal driver gates are required to provide the same total fan-out of the signal supplied to bonding pad 611. This results in a substantial savings of chip real estate, enabling more logic functions to be integrated on chip 610. Incorporating more logic functions on each IC chip could positively impact the partitioning of logic among various IC's in a computer system, reducing the chip count in the system and, correspondingly, lowering the system cost.

FIG. 14 shows a data demultiplexing arrangement formed on integrated circuit chip 620 and utilizing data driver circuits 624 corresponding to a prior art design. Correspondingly, FIG. 15 shows a data demultiplexing arrangement utilizing data driver circuit 300 in accordance with this invention. IC chip 620 shown in FIG. 14 has a bonding pad 621 adapted to receive multiplexed data input signals. The multiplexed data input signals coupled to bonding pad 621 are supplied via conductor pathway 621A to the inputs of data drivers 624. Each output of the three data driver circuits 624 drives four or five demultiplex gates 626. The other input to demultiplex gates 626 is supplied by demultiplex signal generator 625 via a plurality of conductor paths shown as a cable 627. In actual practice, individual conductor paths would be formed on IC chip 620 to connect individual outputs of demultiplex signal generator 25 to individual inputs of demultiplex gates 626. The signals on the demultiplex signal generator output lines comprise sequential pulses provided to demultiplex gates 626 such that each gate is enabled in turn to supply one output data bit contained in the multiplexed data input signal to a corresponding one of sixteen output lines $B_1$ to $B_{16}$. As shown in FIG. 14, it is assumed that data drivers 624 are capable of driving at most five or six demultiplex gates 626 at the signal propagation speeds required for operating IC chip 620. The three data driver circuits occupy a substantial amount of IC chip real estate which is accordingly not available for performing other logic functions.

FIG. 15 shows IC chip 630 utilizing a single data driver circuit 300 (FIG. 9) in accordance with this invention providing fan-out of the multiplexed data signal input on bonding pad 631 to all sixteen of the demultiplex gates 636. Since only one data driver 300 is required due to the active pull-down circuit utilized therein, the chip area occupied by additional data drivers on chip 620 in FIG. 14 can be utilized for the demultiplex signal generator 635. The area used by demultiplex signal generator 625 on chip 620 is available on chip 630 to be used for gates performing other logic functions. This illustrates the opportunity that a reduction in the number of signal driver gates can provide in the more efficient layout of an IC chip to enable more logic functions to be performed on the same chip.

While exemplary embodiments of ECL gates in accordance with this invention have been described, it should be understood that numerous modifications could be made therein by those skilled in the ECL gate array art without departing from the scope of this invention. In the above description and in some of the appended claims the terms "pull-down" and "HIGH-to-LOW signal transitions" have been utilized as convenient nomenclature since the ECL art currently utilizes NPN transistors. It should be understood that the invention described and claimed could utilize PNP transistors, in which case inverted nomenclature would be utilized.

What is claimed is:

1. In a logic system, an emitter coupled logic circuit comprising:
  input difference circuit means including first and second difference circuit branches having respective first and second switching transistors with opposite operating states switching in response to at least one input logic signal and associated first and second load circuits and first and second output nodes;
  emitter-follower transistor circuit means coupled to one of said output nodes of said switching transistors for sensing the operating state thereof and producing an output logic signal corresponding thereto on an output signal node; and
  transition circuit means including a transition transistor coupled between the other one of said output nodes of said switching transistors and said output signal node for providing large current drive to said output signal node during each transition of said output logic signal in one direction and bias circuit connections for said transition transistor directly incorporating at least a portion of an associated one of said load circuits in a manner such that said transition transistor operates only during said output logic signal transitions in said one direction.

2. A logic system as claimed in claim 1, further comprising a logic network coupled to said output signal node and having a large inherent capacitance acting as a load capacitance on said output signal node, whereby said large current drive from said transition transistor rapidly alters the charge state of said load capacitance during output logic signal transitions in said one direction.

3. An emitter coupled logic circuit for supplying an output logic signal to drive a logic network having a relatively large inherent capacitance whose charge state must be substantially altered during each logic level transition of said output logic signal, producing a signal propagation delay directly related to the time interval of said logic level transitions, said emitter coupled logic circuit comprising an emitter-follower transistor and a pull-down circuit coupled in series to form an output terminal at the junction therebetween; a differential input circuit for receiving at least one input logic signal and one reference voltage signal and having a pair of circuit branches each including a differential signal node and an associated load resistor coupled between said differential signal node and a bias voltage node, a preselected one of said differential signal nodes being coupled to said emitter-follower transistor to drive said emitter-follower transistor to produce an output logic signal on said output terminal functionally related to said input logic signal; said pull-down circuit including a pull-down transistor coupled between said output terminal and a pull-down bias node for receiving a pull-down bias voltage, the other one of said differential signal nodes being coupled to said pull-down transistor and said associated load resistor being connected to said output terminal, said pull-down transistor being maintained substantially cut-off by voltages applied thereto during the steady state intervals of said output logic signals and being turned on by the voltage on said output terminal during at least a portion of each HIGH-to-LOW transition of said output logic signal, whereby during each LOW-to-HIGH transition of said output logic signal, heavy current is supplied through said emitter-follower transistor to alter the charge state of said inherent capacitance and, during at least a portion of each HIGH-to-LOW transition of said output logic signal, heavy current is supplied through said pull-down transistor to alter the charge state of said inherent capacitance.

4. Apparatus as claimed in claim 3, wherein said emitter coupled logic circuit and said logic network driven thereby are formed on a single integrated chip with said inherent capacitance comprising the inherent input capacitance of each logic gate in said logic network together with conductor paths formed on said integrated circuit chip for connecting said output terminal of said emitter coupled logic circuit in common to input nodes of logic gates comprising said logic network; said emitter-follower transistor having a collector-emitter circuit connecting said output terminal to a first bias node for receiving a relatively positive bias voltage and said pull-down circuit further comprises a pull-down resistor connected between said output terminal and a second bias node for receiving a relatively negative bias voltage to form a resistive load for said emitter-follower transistor; and said pull-down bias voltage has a value intermediate said bias voltages on said first and second bias nodes.

5. In combination on an integrated circuit chip: first and second bias nodes for receiving a first relatively positive bias voltage and a second relatively negative bias voltage, respectively; circuit means coupled to said first and second bias nodes for generating at least one reference voltage intermediate said first and second bias voltages and a pull-down voltage intermediate said first and second bias voltages; a first emitter coupled logic circuit having an output node with an output logic signal thereon; a multiplicity of other emitter coupled logic circuits each having an input node arranged to receive the logic signal on said output node; and conductor paths formed on said integrated circuit chip connecting said output node with each of said input nodes; said input nodes of said other logic circuits and said conductor paths having inherent capacitances together constituting a load capacitance on said output node whose charge state must be substantially altered during each logic level transition of said output logic signal; said first logic circuit comprising an emitter follower transistor having emitter and collector electrodes connected respectively to said output node and said first bias node; a pull-down resistor connected between said output node and said second bias node; a pull-down transistor having collector and emitter electrodes connected to said output terminal and said pull-down bias node, respectively; and a difference circuit including at least one input node for receiving an input logic signal, at least one reference signal node connected to said reference bias node and a pair of circuit branches each including at least one transistor and an associated load resistor connected in series to form a differential signal node at the junction therebetween, a preselected one of said differential signal nodes being coupled to the base electrode of said emitter follower transistor and an associated load resistor being coupled to said first bias node, the other of said differential signal nodes being coupled to the base electrode of said pull-down transistor and the associated load resistor being connected to said output node, said pull-down transistor being maintained substantially cut-off by voltages applied thereto during the steady state intervals of said output logic signal on said output node and being turned on by the voltage on said output node during at least a portion of each HIGH-to-LOW transition of said output logic signal to assist said pull-down resistor in altering the charge state of said load capacitance to minimize the signal propagation delay during said HIGH-to-LOW transition.

6. Apparatus as claimed in claim 5, further comprising a bias resistor coupled between the base of said pull-down transistor and said first bias node to bias said pull-down transistor closer to its turn on point during a steady state HIGH level of said output logic signal and to combine with said associated load resistor to form a voltage divider for said output signal during said HIGH-to-LOW signal transition, whereby said pull-down transistor is turned on sooner and and stays on longer during said transition to alter the charge state of said load capacitance more rapidly.

7. An emitter coupled logic circuit comprising an emitter follower transistor and a pull-down resistor coupled in series between a pair of bias terminals and forming an output terminal at the junction therebetween; a difference circuit having first and second circuit branches coupled between a pair of bias terminals, said first branch including a logic input circuit having one or more input transistors for receiving one or more input logic signals and an associated load resistor coupled in series to form a first differential signal node at the junction therebetween, said second branch including a reference input circuit including one or more reference transistors for receiving one or more separate reference bias signals and an associated load resistor coupled in series to form a second differential signal node at the junction therebetween, a prearranged one of said differential signal nodes being coupled to the base of said emitter follower transistor to drive said emitter follower transistor to produce an output logic signal functionally related to said input logic signals for driving a logic network having an inherent capacitance effectively constituting load capacitance on said output terminal, the charge state of said load capacitance being substantially altered during each logic level transition of said output logic signal; and a pull-down transistor coupled between said output terminal and a bias terminal for receiving a pull-down bias voltage, the other of said differential signal nodes being coupled to the base of said pull-down transistor with said associated load resistor being connected to said output terminal, said pull-down transistor being maintained substantially cut-off by voltages applied thereto during the steady state intervals of said output logic signal and being turned on by the voltage on said output terminal during at least a portion of each HIGH-to-LOW transition of said output logic signal to assist said first resistor in altering the charge state of said load capacitance and thereby to shorten the interval of each said HIGH-to-LOW transition of said output logic signal.

8. In an emitter coupled logic network formed on an integrated circuit chip, a first emitter coupled logic circuit having at least one input node and an output node; a multiplicity of other emitter coupled logic circuits each having an input node arranged to receive the logic signal on said output node; and conductor paths formed on said integrated circuit chip connecting said output node with each of said input nodes; said input nodes of said other emitter coupled logic circuits and said conductor paths having inherent capacitances together constituting a load capacitance on said output node, the charge state of which is substantially altered during each logic level transition of the logic signal on said output node; said first logic circuit comprising an emitter follower transistor and a pull-down resistor coupled in series between a pair of bias terminals and forming said output node at the junction therebetween; a difference circuit having first and second circuit branches coupled between a pair of bias terminals, said first branch including a logic input circuit having one or more input transistors for receiving one or more input logic signals and an associated load resistor coupled in series to form a first differential signal node at the junction therebetween, and said second branch including a reference input circuit including one or more reference transistors for receiving one or more reference bias signals and an associated load resistor coupled in series to form a second differential signal node at the junction therebetween, a prearranged one of said differential signal nodes being coupled to the base of said emitter follower transistor to drive said emitter follower transistor to produce an output logic signal on said output node functionally related to said input logic signals; a pull-down circuit including a pull-down transistor coupled between said output terminal and a bias terminal for receiving a pull-down bias voltage, the other of said differential signal nodes being coupled to the base of said pull-down transistor and said associated load resistor being connected to said output terminal, said pull-down transistor being maintained substantially cut-off by voltages applied thereto during the steady state intervals of said output logic signal and being turned on by the voltage on said output terminal during at least a portion of each HIGH-to-LOW transition of said output logic signal to assist in altering the charge state of said load capacitance and thereby to shorten the interval of each HIGH-to-LOW transition and to reduce the signal propagation delay between said first logic circuit and said other logic circuits.

9. In combination, a circuit board carrying a plurality of component mounting pads and conductor pathways providing signal communication lines between prearranged ones of said component mounting pads; an integrated circuit package mounted on said circuit board and having a plurality of terminals connected to prearranged ones of said component mounting pads and an integrated circuit chip mounted in said package and having a plurality of bonding pads connected to prearranged ones of said terminals, said integrated circuit chip comprising a multiplicity of active and passive circuit components and conductor paths formed in a prearranged monolithic fashion on a semiconductor substrate to constitute a multiplicity of logic circuits and prearranged bias and logic signal communication lines among said logic circuits and said bonding pads, at least one of said logic circuits comprising an emitter coupled logic circuit having output node connected via prearranged ones of said bonding pads, said terminals, said mounting pads, and said conductor pathways to a logic utilization circuit and thus having a relatively large inherent load capacitance whose charge state is substantially altered during each logic level transition of a logic signal on said output node; and a pull-down resistor mounted on said circuit board with conductive pathways connecting one end to said prearranged one of said mounting pads and another end to a pull-down bias terminal, said pull-down resistor assisting in altering the charge state of said load capacitance during a HIGH-to-LOW transition of said logic signal on said output node; said emitter coupled logic circuit further comprising an emitter follower transistor coupled between a bias node and said output node; a difference circuit having first and second circuit branches coupled between a pair of bias nodes, said first branch including a logic input circuit having one or more input transistors for receiving one or more input logic signals and an associated load resistor coupled in series to form a first differential signal node at the junction therebetween, said second branch including a reference input circuit including one or more reference transistors for receiving one or more separate reference bias signals and an associated load resistor coupled in series to form a second differential signal node at the junction therebetween, a prearranged one of said differential signal nodes being coupled to the base of said emitter follower transistor to drive said emitter follower transistor to produce an output logic signal functionally related to said input logic signals; and a pull-down circuit including a pull-down transistor coupled between said output node and a bias terminal for receiving a pull-down bias voltage, the other one of said differential signal nodes being coupled to the base of said pull-down transistor and said associated load resistor being connected to said output terminal, said pull-down transistor being maintained substantially cut-off by the voltages applied thereto during the steady state intervals of said output logic signal and being turned on by the voltage on said output terminal during at least a portion of each HIGH-to-LOW transition of said output logic signal in one direction to assist said pull-down resistor in altering the charge state of said load capacitance thereby to shorten the interval of each HIGH-to-LOW signal transition.

10. In combination on an integrated circuit chip: a plurality of bonding pads for receiving individual signals including a driving logic signal and direct current bias voltage for operating circuitry formed on said chip; a multiplicity of logic circuits having input nodes for receiving a logic signal corresponding to said driving logic signal; a signal driver circuit having an input node for receiving said driving logic signal and an output node for supplying a corresponding output logic signal to said input nodes of said multiplicity of logic circuits; a first conductor path for connecting said input node of said signal driver circuit to one of said bonding pads to communicate said driving logic signal thereto; and second conductor paths for connecting said input nodes of said logic circuits to said output node of said signal driver circuit; said second conductor paths and said input nodes of said logic circuits having inherent capacitances together constituting a load capacitance on said output node of said driver circuit whose charge state is substantially altered during transition intervals of the output logic signal thereon; said signal driver circuit comprising an emitter follower transistor and a pull-down resistor coupled in series between a pair of bias nodes to form said output node at the junction therebetween; a difference circuit having first and second circuit branches coupled between said pair of bias nodes, said first branch including a load resistor and a logic input transistor having a base electrode serving as said input node and a collector-emitter circuit coupled in series with said load resistor to form a first differential signal node at the junction therebetween, said second branch including a load resistor and a reference transistor having a base electrode for receiving a reference bias signal and a collector-emitter circuit coupled in series with said load resistor to form a second differential signal node at the junction therebetween, said second differential signal node being coupled to the base of said emitter follower transistor to produce said output logic signal; and a pull-down circuit including a pull-down transistor having a collector-emitter circuit coupled between said output terminal and a bias terminal for receiving a pull-down bias voltage and a base terminal connected to said first differential signal node, said load resistor associated with said first differential signal node being connected to said output terminal, said pull-down transistor being maintained substantially cut-off by voltages applied thereto during the steady state intervals of said output logic signal and being turned on by the voltage on said output terminal during at least a portion of each HIGH-to-LOW transition of said output logic signal to assist said pull-down resistor in altering the charge state of said load capacitance and thereby to shorten the interval of each HIGH-to-LOW transition of said output signal.

11. In combination on an integrated circuit chip: a plurality of bonding pads for receiving individual signals including a multiplexed binary data signal comprising a series of data words and direct current bias voltages for operating circuits formed on said chip, a plurality of demultiplex gates, one for each of the bits in said data word, each of said gates having a first input node for receiving an input signal corresponding to said multiplexed data signal and a second input node for receiving one of a plurality of sequential demultiplex signals; a single data driver circuit having an input node for receiving said multiplexed data signal and an output node for supplying a corresponding signal to said first input nodes of said demultiplex gates; a demultiplex signal generator for generating said plurality of sequential demultiplex signals; a first conductor path connecting a prearranged one of said bonding pads to said input node of said data driver circuit to communicate said multiplexed data signal thereto; a second conductor path connecting said output node of said data driver circuit to each of said first input nodes of said demultiplexed gates; and a set of conductor paths connecting said demultiplexed signal generator to said second input nodes of said demultiplex gates to communicate said sequential demultiplex signals thereto; said second conductor path and said first input nodes of said demultiplexed gates having together an inherent capacitance constituting a load capacitance on said output node of said data driver circuit whose charge state is substantially altered during transition intervals of the multiplexed data signal thereon; said data driver circuit comprising an emitter follower transistor and a pull-down resistor coupled in series between a pair of bias nodes to form said output node at the junction therebetween; a difference circuit having first and second circuit branches coupled between said pair of bias nodes, said first branch including a load resistor and a logic input transistor having a base electrode serving as said input node and a collector-emitter circuit coupled in series with said load resistor to form a first differential signal node at the junction therebetween, said second branch including a load resistor and a reference transistor having a base terminal for receiving a reference bias signal and a collector-emitter circuit coupled in series with said load resistor to form a second differential signal node at the junction therebetween, said second differential signal node being coupled to the base of said emitter follower transistor to produce said output logic signal; and a pull-down circuit including a pull-down transistor having a collector-emitter circuit coupled between said output terminal and a bias terminal for receiving a pull-down bias voltage and a base terminal connected to said first differential signal node, said load resistor associated with said first differential signal node being connected to said output terminal, said pull-down transistor being maintained substantially cut-off by voltages applied thereto during the steady state intervals of said output logic signal and being turned on by the voltage on said output terminal during at least a portion of a HIGH-to-LOW transition of said output logic signal to assist said pull-down resistor in altering the charge state of said load capacitance and thereby to shorten the interval of said HIGH-to-LOW transition of said output signal.

12. Apparatus as claimed in any one of claims 8, 9, 10, and 11 wherein said pull-down circuit further includes a bias resistor coupled between one of said biased terminals and said base of said pull-down transistor to bias said pull-down transistor closer to its turn-on point, said bias resistor combining with said associated load resistor of said first differential signal node to form a voltage divider for said output signal during said HIGH-to-LOW signal transition, whereby said pull-down transistor is turned on sooner and harder at the beginning of each said HIGH-to-LOW transition and stays on longer during said transitions to alter the charge state of said load capacitance more rapidly.

* * * * *